United States Patent
Martinsen et al.

(10) Patent No.: US 10,464,172 B2
(45) Date of Patent: Nov. 5, 2019

(54) PATTERNING CONDUCTIVE FILMS USING VARIABLE FOCAL PLANE TO CONTROL FEATURE SIZE

(71) Applicant: nLIGHT Photonics Corporation, Vancouver, WA (US)

(72) Inventors: Robert J. Martinsen, West Linn, OR (US); Adam Dittli, Vancouver, WA (US); Ken Gross, Vancouver, WA (US)

(73) Assignee: nLIGHT, Inc., Tualatin, OR (US)

( * ) Notice: Subject to any disclaimer, the term of this patent is extended or adjusted under 35 U.S.C. 154(b) by 772 days.

(21) Appl. No.: 14/768,595

(22) PCT Filed: Feb. 21, 2014

(86) PCT No.: PCT/US2014/017836
§ 371 (c)(1),
(2) Date: Aug. 18, 2015

(87) PCT Pub. No.: WO2014/130892
PCT Pub. Date: Aug. 28, 2014

(65) Prior Publication Data
US 2016/0001402 A1    Jan. 7, 2016

Related U.S. Application Data

(63) Continuation-in-part of application No. 14/030,799, filed on Sep. 18, 2013, now Pat. No. 9,537,042.
(Continued)

(51) Int. Cl.
*G02B 26/08*    (2006.01)
*B23K 26/40*    (2014.01)
(Continued)

(52) U.S. Cl.
CPC ............ *B23K 26/40* (2013.01); *B23K 26/361* (2015.10); *G02B 26/101* (2013.01);
(Continued)

(58) Field of Classification Search
CPC .. G02B 26/0858; B23K 26/00; B23K 26/361; B23K 26/40
(Continued)

(56) References Cited

U.S. PATENT DOCUMENTS 3,388,461 A    6/1968   Lins
4,713,518 A    12/1987  Yamazaki et al.
(Continued)

FOREIGN PATENT DOCUMENTS

CN    1217030 C    8/2005
CN    1926460      3/2007
(Continued)

OTHER PUBLICATIONS

Kummer et al., "Method to quantify accuracy of position feedback signals of a three-dimensional two-photon laser-scanning microscope," Biomedical Optics Express, 6(10):3678-3693 (Sep. 1, 2015).
(Continued)

*Primary Examiner* — Christina A Johnson
*Assistant Examiner* — Xue H Liu
(74) *Attorney, Agent, or Firm* — Klarquist Sparkman, LLP

(57) ABSTRACT

A processing system directs a laser beam to a composite including a substrate, a conductive layer, and a conductive border. The location of a focus of the laser beam can be controlled to bring the laser beam into focus on the surfaces of the conductive materials. The laser beam can be used to ablatively process the conductive border and non-ablatively process the conductive layer by translating a focus-adjust optical system so as to vary laser beam diameter.

21 Claims, 8 Drawing Sheets

Related U.S. Application Data

(60) Provisional application No. 61/818,881, filed on May 2, 2013, provisional application No. 61/767,420, filed on Feb. 21, 2013.

(51) Int. Cl.
  *G02B 26/10* (2006.01)
  *H01L 31/18* (2006.01)
  *B23K 26/361* (2014.01)
  *B23K 103/00* (2006.01)

(52) U.S. Cl.
  CPC ........ *G02B 26/105* (2013.01); *H01L 31/1884* (2013.01); *B23K 2103/50* (2018.08); *G06F 2203/04112* (2013.01); *Y02E 10/50* (2013.01)

(58) Field of Classification Search
  USPC ..................................... 264/400; 359/223.1
  See application file for complete search history.

(56) References Cited

U.S. PATENT DOCUMENTS

| | | |
|---|---|---|
| 4,863,538 A | 9/1989 | Deckard |
| 5,008,555 A | 4/1991 | Mundy |
| 5,252,991 A | 10/1993 | Storlie et al. |
| 5,509,597 A | 4/1996 | Laferriere |
| 5,523,543 A | 6/1996 | Hunter, Jr. et al. |
| 5,642,198 A | 6/1997 | Long |
| 5,684,642 A | 11/1997 | Zumoto et al. |
| 5,719,386 A | 2/1998 | Hsieh et al. |
| 5,932,119 A | 8/1999 | Kaplan et al. |
| RE37,585 E | 3/2002 | Mourou et al. |
| 6,353,203 B1 | 3/2002 | Hokodate et al. |
| 6,362,004 B1 | 3/2002 | Noblett |
| 6,426,840 B1 | 7/2002 | Partanen et al. |
| 6,490,376 B1 | 12/2002 | Au et al. |
| 6,577,314 B1 | 6/2003 | Yoshida et al. |
| 7,151,788 B2 | 12/2006 | Imakado et al. |
| 7,349,123 B2 | 3/2008 | Clarke et al. |
| 7,781,778 B2 | 8/2010 | Moon et al. |
| 8,071,912 B2 | 12/2011 | Costin, Sr. et al. |
| 8,237,788 B2 | 8/2012 | Cooper et al. |
| 8,251,475 B2 | 8/2012 | Murray et al. |
| 8,269,108 B2 | 9/2012 | Kunishi et al. |
| 8,310,009 B2 | 11/2012 | Saran et al. |
| 8,414,264 B2 | 4/2013 | Bolms et al. |
| 8,442,303 B2 | 5/2013 | Cheng et al. |
| 8,472,099 B2 | 6/2013 | Fujino et al. |
| 8,809,734 B2 | 8/2014 | Cordingley et al. |
| 9,537,042 B2 | 1/2017 | Dittli et al. |
| 2001/0050364 A1 | 12/2001 | Tanaka et al. |
| 2003/0213998 A1 | 11/2003 | Hsu et al. |
| 2004/0031779 A1* | 2/2004 | Cahill .................. B23K 26/04 |
| | | 219/121.83 |
| 2004/0112634 A1 | 6/2004 | Tanaka et al. |
| 2004/0207936 A1 | 10/2004 | Yamamoto et al. |
| 2005/0168847 A1 | 8/2005 | Sasaki |
| 2005/0233557 A1 | 10/2005 | Tanaka et al. |
| 2006/0275705 A1 | 12/2006 | Dorogy et al. |
| 2007/0075060 A1 | 4/2007 | Shedlov et al. |
| 2008/0246024 A1 | 10/2008 | Touwslager et al. |
| 2009/0122377 A1 | 5/2009 | Wagner |
| 2009/0274833 A1 | 11/2009 | Li |
| 2009/0314752 A1 | 12/2009 | Manens et al. |
| 2010/0025387 A1 | 2/2010 | Arai et al. |
| 2010/0225974 A1 | 9/2010 | Sandstrom |
| 2010/0230665 A1 | 9/2010 | Verschuren et al. |
| 2010/0252543 A1 | 10/2010 | Manens et al. |
| 2011/0080476 A1 | 4/2011 | Dinauer et al. |
| 2011/0127697 A1 | 6/2011 | Milne |
| 2011/0133365 A1* | 6/2011 | Ushimaru .......... B23K 26/0075 |
| | | 264/400 |
| 2011/0187025 A1* | 8/2011 | Costin, Sr. ................ B41M 5/24 |
| | | 264/400 |
| 2011/0278277 A1 | 11/2011 | Stork Genannt Wersborg |
| 2011/0279826 A1 | 11/2011 | Miura et al. |
| 2012/0127097 A1 | 5/2012 | Gaynor et al. |
| 2012/0145685 A1 | 6/2012 | Ream et al. |
| 2012/0148823 A1 | 6/2012 | Chu |
| 2012/0156458 A1 | 6/2012 | Chu |
| 2012/0295071 A1 | 11/2012 | Sato |
| 2012/0301733 A1 | 11/2012 | Eckert et al. |
| 2012/0301737 A1 | 11/2012 | Labelle et al. |
| 2013/0005139 A1 | 1/2013 | Krasnov et al. |
| 2013/0022754 A1 | 1/2013 | Bennett et al. |
| 2013/0023086 A1 | 1/2013 | Chikama et al. |
| 2013/0027648 A1 | 1/2013 | Moriwaki |
| 2013/0095260 A1 | 4/2013 | Bovatsek et al. |
| 2013/0228442 A1 | 9/2013 | Mohaptatra et al. |
| 2013/0299468 A1 | 11/2013 | Unrath et al. |
| 2014/0104618 A1 | 4/2014 | Potsaid et al. |
| 2014/0155873 A1 | 6/2014 | Bor |
| 2014/0332254 A1 | 11/2014 | Pellerite et al. |
| 2014/0333931 A1 | 11/2014 | Lu et al. |
| 2015/0165556 A1 | 6/2015 | Jones et al. |
| 2015/0352664 A1 | 12/2015 | Errico et al. |
| 2016/0158889 A1 | 6/2016 | Carter et al. |
| 2016/0187646 A1 | 6/2016 | Ehrmann |

FOREIGN PATENT DOCUMENTS

| | | |
|---|---|---|
| CN | 1966224 | 5/2007 |
| CN | 101836309 | 10/2007 |
| CN | 101143405 | 3/2008 |
| CN | 101303269 | 11/2008 |
| CN | 101314196 | 12/2008 |
| CN | 102448623 | 3/2009 |
| CN | 101733561 | 6/2010 |
| CN | 201783759 | 4/2011 |
| CN | 102084282 | 6/2011 |
| CN | 102176104 | 9/2011 |
| CN | 102207618 | 10/2011 |
| CN | 102301200 | 12/2011 |
| CN | 102441740 | 5/2012 |
| DE | 203 20 269 | 4/2004 |
| DE | 202016004237 U1 | 9/2016 |
| EP | 2587564 | 5/2013 |
| EP | 2642246 A2 | 9/2013 |
| JP | H02220314 | 9/1990 |
| JP | 2006-106227 | 4/2006 |
| JP | 2008-281395 | 11/2008 |
| KR | 10-2011-0109957 | 10/2011 |
| RU | 2008742 | 2/1994 |
| RU | 2021881 | 10/1994 |
| TW | 553430 | 9/2003 |
| TW | 200633062 | 9/2006 |
| TW | I271904 | 1/2007 |
| TW | 200707466 | 2/2007 |
| TW | 201307949 | 2/2013 |
| WO | WO 1995/011100 | 4/1995 |
| WO | WO 1995/011101 | 4/1995 |
| WO | WO 2012/102655 | 8/2012 |

OTHER PUBLICATIONS

Search Report from the Taiwan Intellectual Property Office for related Application No. 102139285, 10 pages, dated Sep. 4, 2017 (w/ Eng. trans.).
Second Office Action from Chinese Application No. 201480019324.8, dated Nov. 16, 2017, 21 pages (with English translation).
Office Action (with English translation) for related Korea Application No. 10-2014-0120247, dated Oct. 18, 2017, 6 pages.
PCI-6110, Multifunction I/O Device, http://www.ni.com/en-us-support/model.pci-6110.html, downloaded Dec. 15, 2017, 1 page.
First Office Action from Chinese Application No. 201410455972.X, dated Jan. 26, 2016, 21 pages (with English translation).
Official Letter and Search Report from the Taiwan Intellectual Property Office for related Application No. 102139285, 21 pages, dated Jun. 13, 2016 (w/ Eng. trans.).
Official Letter and Search Report from Taiwan Application No. 103106020, dated Jun. 6, 2017, 7 pages (with English translation).

(56) References Cited

OTHER PUBLICATIONS

Office Action (w/ English translation) for related Chinese Application No. 201380075745.8, 21 pages, dated Jun. 2, 2017.
Official Action (w/English translation) for related Taiwan application No. 103130968 dated Jun. 7, 2017, 5 pages.
Product Brochure entitled "3-Axis and High Power Scanning" by Cambridge Technology, 4 pages, downloaded Dec. 21, 2013.
Product Brochure supplement entitled "Theory of Operation" by Cambridge Technology, 2 pages, downloaded Dec. 21, 2013.
Search Report from the Taiwan Intellectual Property Office (w/ English translation) for related Application No. 102139285, dated Sep. 1, 2015.
Website describing 3-Axis Laser Scanning Systems at http://www.camtech.com/index.php?option=com_content&view=article&id=131&Itemid=181, 4 pages, accessed Dec. 31, 2014.
Official Letter and Search Report from the Taiwan Intellectual Property Office for related Application No. 102139285, 8 pages, dated Nov. 21, 2016 (w/ Eng. trans.).
Second Office Action from Chinese Application No. 201410455972.X, dated Nov. 22, 2016, 22 pages (with English translation).
Official Letter and Search Report from Taiwan Application No. 103130968, dated Dec. 20, 2016, 16 pages (with English translation).
Affine Transformation—from Wolfram MathWorld, http://mathworld.wolfram.com/AffineTransformation.html, downloaded Feb. 21, 2014, 2 pages.
First Office Action from Chinese Application No. 201480019324.8, dated Apr. 5, 2017, 20 pages (with English translation).
International Search Report and Written Opinion for International Application No. PCT/US2016/063086, 6 pages, dated Mar. 23, 2017.
International Search Report and Written Opinion for International Application No. PCT/US2017/014182, 9 pages, dated Mar. 31, 2017.
Java—Transform a triangle to another triangle—Stack Overflow, http://stackoverflow.com/questions/1114257/transform-a-triangle-to-another-triangle?lq=1, downloaded Feb. 21, 2014, 3.

Office Action (no English translation) for related Chinese Application No. 201480022179.9, 5 pages, dated Mar. 30, 2017.
Office Action (with English translation) for related Korea Application No. 10-2014-0120247, dated Apr. 14, 2017, 11 pages.
Second Office Action from Chinese Application No. 201380075745.8, dated Feb. 26, 2018, 6 pages (with English translation).
Third Office Action from Chinese Application No. 201480019324.8, dated Apr. 13, 2018, 8 pages (with English translation).
Official Letter and Search Report from the Taiwan Intellectual Property Office for related Application No. 103106020, 21 pages, dated Apr. 20, 2016 (w/ Eng. trans.).
Chung, "Solution-Processed Flexible Transparent Conductors Composed of Silver Nanowire Networks Embedded in Indium Tin Oxide Nanoparticle Matrices," Nano Research, 10 pages (Sep. 24, 2012).
Gardner, "Precision Photolithography on Flexible Substrates," http://azorescorp.com/downloads/Articles/AZORESFlexSubstrate.pdf (prior to Jan. 30, 2013).
Grigoriyants et al., "Tekhnologicheskie protsessy lazernoy obrabotki," Moscow, izdatelstvo MGTU im. N.E. Baumana, p. 334 (2006).
International Search Report and Written Opinion for International Application No. PCT/US2013/060470, 7 pages, dated Jan. 16, 2014.
International Search Report and Written Opinion for International Application No. PCT/US2014/017841, 5 pages, dated Jun. 5, 2014.
International Search Report and Written Opinion for International Application No. PCT/US2014/017836, 6 pages, dated Jun. 10, 2014.
Notice of Preliminary Rejection from the Korean Intellectual Property Office for related Application No. 10-2015-7025813, dated Jun. 26, 2018, 18 pages (with English translation).
International Search Report and Written Opinion dated Aug. 8, 2018 for Application No. PCT/US2018/026110 by the European Patent Office acting as International Searching Authority (12 pages).
Decision of Rejection from the Korean Intellectual Property Office for related Application No. 10-2015-7025813, 6 pages, dated Nov. 29, 2018 (English translation included).
Notice of Preliminary Rejection for Korean Application No. 10-2015-7025812, dated Jun. 13, 2019, 11 pages (includes English-language machine translation).

* cited by examiner

PATTERNING CONDUCTIVE FILMS USING VARIABLE FOCAL PLANE TO CONTROL FEATURE SIZE

CROSS-REFERENCE TO RELATED APPLICATIONS

This is the U.S. National Stage of International Application No. PCT/US2014/017836, filed Feb. 21, 2014, which was published in English under PCT Article 21(2), which in turn claims the benefit of U.S. Provisional Patent Applications Nos. 61/767,420, filed Feb. 21, 2013, and 61/818,881, filed May 2, 2013, and which is a Continuation-in-Part of U.S. Non-provisional Application Ser. No. 14/030,799, filed Sep. 18, 2013, which claims the benefit of U.S. Provisional Patent Applications Nos. 61/767,420, filed Feb. 21, 2013, and 61/818,881, filed May 2, 2013. The PCT, non-provisional, and provisional application are incorporated herein by reference in their entirety.

FIELD

The present disclosure relates generally to laser patterning of materials, and more particularly to methods, devices, and systems for laser patterning using variable laser beam diameters.

BACKGROUND

Strong demand for smaller and more portable computing devices has led to substantial innovation in many corresponding areas, including touch screens for smartphones and tablet computers. However, there remains much room for improvement in the area of touch sensor patterning and printed electronics. Existing technologies, including photolithography, screen printing, and laser processing, suffer from various drawbacks due in part to the number of processing steps required and the costs and time consumed in switching between various processing steps. In addition to costs associated with various processing steps, photolithographic and screen printing techniques include numerous drawbacks, including increased cost associated with expensive consumables and toxic waste. Conventional laser processing techniques also suffer from numerous drawbacks. It is unfortunate that the current state of the art has yet to produce more efficient methods and systems for processing printed electronics and touch sensors. Accordingly, there remains a need for improved methods and systems for processing these devices without the attendant drawbacks.

SUMMARY

An optical processing system comprises an objective lens situated to direct a processing optical beam to a target surface and a scanning system situated to scan the processing optical beam across the target surface. A focus-adjust optical system includes a focus-adjust optical element and a focus actuator, the focus-adjust optical element situated to direct the optical beam to the objective lens. The focus actuator is coupled to the focus-adjust optical element so as to translate the focus-adjust optical element along an axis of the objective lens so as to maintain a focus of the processing beam as the processing beam is scanned across the target surface. A beam diameter actuator is situated to translate the focus-adjust optical system so as to define a processing beam diameter at the target surface. In some examples, a controller is coupled to the focus actuator so as to maintain the focus of the processing beam during scanning across the target surface. In other examples, a substrate stage includes a stage actuator situated to position the target surface along the axis of the objective lens. In further examples, the controller is coupled to the beam diameter actuator and the stage actuator and the controller translates the focus adjust optical system and the substrate stage based on a selected beam diameter. In a particular example, the beam diameter actuator produces stepwise translations of the focus adjust optical system, and is translatable to at least two locations along the axis of the objective lens, the at least two locations associated with corresponding focused beam diameters having a larger to smaller diameter ratio of at least 2:1, 3:1, 4:1, 5:1, 7.5:1, or 10:1. Typically, the beam diameter actuator is situated to translate the focus-adjust optical system so as to define at least two processing beam diameters corresponding to ablative processing and non-ablative processing of silver paste conductive borders, and silver nanowire or indium tin oxide conductive layers, or vice versa. In some examples, a laser produces the processing beam, and a laser controller selects optical beam powers based on the processing beam diameters.

Methods include translating a focus adjust optical element along an axis of an objective lens while processing a substrate with an optical beam from the objective lens so as to maintain a processing beam focus at a target. A processing beam diameter is selected by translating the focus adjust optical element along the axis of the objective lens. In some examples, processing beam diameter is selected from among at least two predetermined values, wherein the predetermined values have a larger to smaller diameter ratio of at least 1.5:1. In other examples, the target is a composite having a conductive layer and a conductive border, wherein the at least two predetermined values include first and second processing beam diameters selected for processing the conductive layer and the conductive border, respectively. In additional examples, the first and second processing beam diameters are selected so that the conductive layer is processed non-ablatively and the conductive border is processed ablatively or vice versa. In typical applications, the processing beam diameters are selected to process one or more of a silver nanowire or indium tin oxide conductive layer and a silver paste conductive border. In some embodiments, the target is translated along the axis of the objective lens based on the selected processing beam diameter. In a representative example, at least two processing beam diameters are selected for processing a conductive layer and a conductive border of a composite substrate, wherein the processing beam diameters are selected from among at least two predetermined values, wherein the predetermined values have a larger to smaller diameter ratio of at least 2:1.

The foregoing and other objects, features, and advantages of the invention will become more apparent from the following detailed description, which proceeds with reference to the accompanying figures.

DETAILED DESCRIPTION

Figure 1:
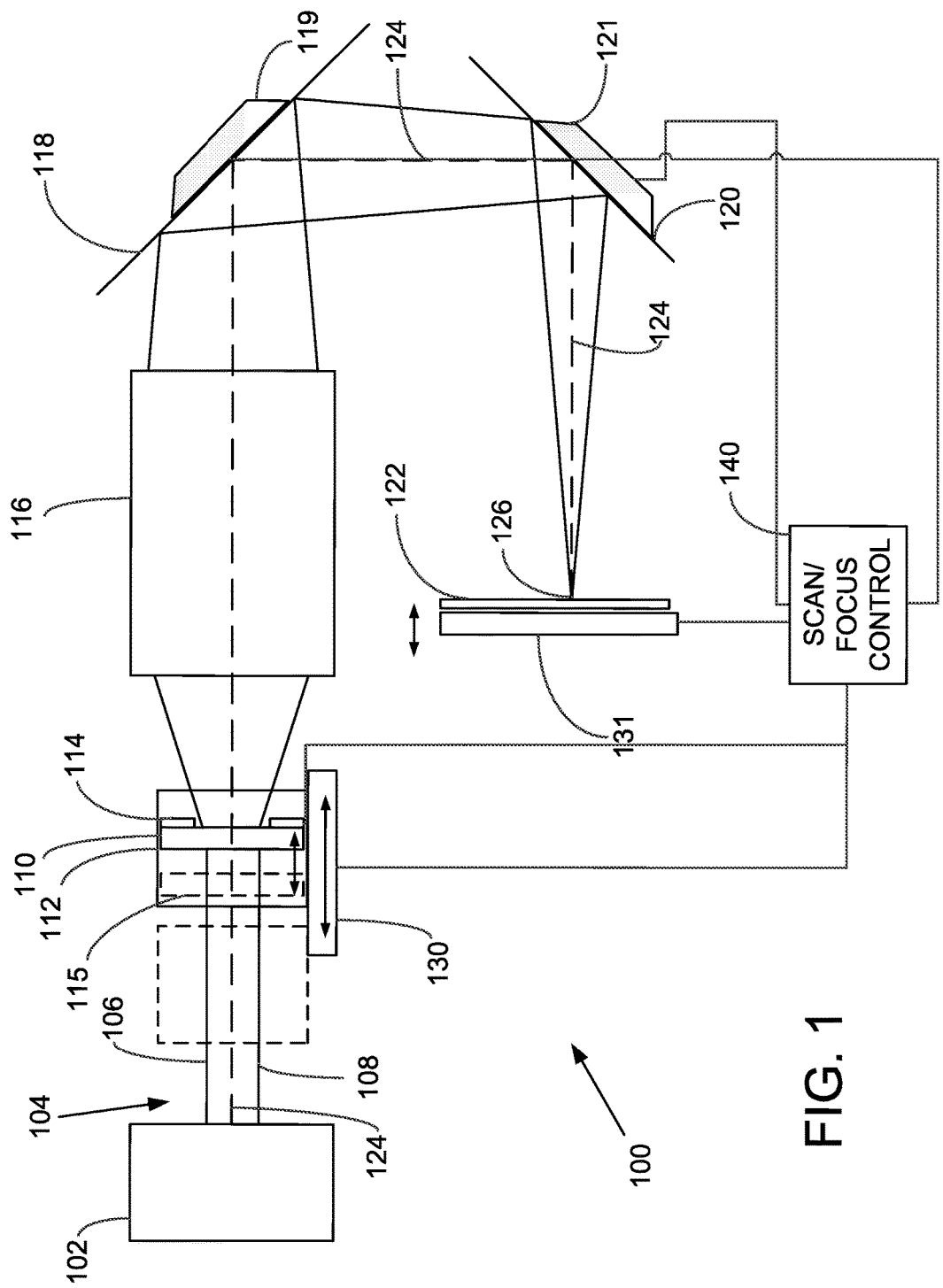
FIG. 1 shows an exemplary laser-based processing system.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

For convenient description, terms such as "top," "upper," "lower," "bottom" and the like are used to describe certain features of the disclosed embodiments. Such terms are not intended to refer to a particular orientation, but are instead used to indicate relative positions.

As used herein, laser beam diameters are generally based on $1/e^2$ intensities for a lowest order $TEM_{00}$ mode or similar power distribution. The terms "axis" or "optical axis" refer to axes coupling optical elements. Such axes need not be a single straight line segment, but can include a plurality of line segments corresponding to bends and folds produced with mirrors, prisms, or other optical elements. As used herein, a lens refers to single lens element or multi-element (compound) lenses.

The present disclosure relates generally to the use of laser scanning systems to process printed electronics and/or touch sensors for use in electronic devices. In some cases, laser scanning systems can be used to process materials such as composite films for use in electronic devices (e.g., for use as touchscreens in electronic devices). In one exemplary processing scenario, one or more conductive materials (e.g., a layer of silver nanowires and a border of silver paste) can be deposited onto a substrate, and a laser scanning system can be used to process the conductive materials (e.g., to reduce the conductivity of portions of the conductive layer, or to form various features through ablation of the material). The present disclosure provides various advantages over prior touchscreen fabrication processes, including screen printing and/or lithographic techniques. In particular, the present disclosure allows both a main body of a touchscreen and its IC raceways to be processed using a single laser scanning device.

Steps for processing a composite film can be configured so that touch sensitive regions for use in various display devices are formed in the composite film. Other suitable applications for processed materials can include display devices more generally, as well as LED phosphor enhancements, other commercial and consumer lighting applications, wearable electronics, and photovoltaic cells. However, composite films are particularly well-suited for mobile consumer displays, where thinner, more durable, and more flexible formats are highly desirable. When used as a mobile consumer device display, it can be advantageous for a composite film (and thus each layer of material making up the composite film) to be flexible and/or transparent. However, depending on the intended use of the final product, it can be advantageous for a composite film to be at least partially or highly opaque, and/or at least partially or highly rigid. The systems, devices, and processes described herein can be used to process composite films regardless of their transparency and/or rigidity. Composite films can be referred to herein simply as composites.

The substrate used can be formed from a variety of materials. For example, the substrate can be made of polyethylene terephthalate (PET) because of its low cost and advantageous features, including transparency, flexibility, resilience, ease of manufacture, etc. A nonexhaustive list of other possible substrate materials includes polyethylene naphthalate, polyurethane, various plastics, various glasses, and various metals. The substrate can have various thicknesses. For example, the substrate can have a thickness between about 10 μm and 1 mm, or between about 50 μm and 200 μm, or in one specific example, about 130 μm.

In some cases, a flexible and transparent composite material includes a substrate (e.g., PET) with a layer of silver nanowires (also referred to as SNW or AgNW) deposited thereon to a predetermined thickness or to a predetermined conductivity, either of which can be achieved by increasing or decreasing the density of the silver nanowires during composite production. The layer of silver nanowires can have various thicknesses, such as a thickness between about 1 nm and 100 nm, or between about 3 nm and 70 nm, or between about 30 nm and 50 nm. Silver nanowires are well-suited for flexible substrates, as their material properties, such as conductivity and structural integrity, are more consistent under bending loads of various types (e.g., fixedly curved, cyclically deformed, or pliable). In some cases, indium tin oxide (ITO) or other suitable materials can be used instead of silver nanowires.

FIG. 1 shows one embodiment of a laser scanning system 100. The system 100 includes a source 102 of a laser beam 104, illustrated by a pair of ray lines 106, 108. The laser beam 104 propagates along an optical axis 124, shown in dashed lines, from the source 102 to a focus-control lens 110 that is retained by a housing 112. The lens 110 can be a single optical element such as a plano-concave or double concave lens, or a compound lens that includes two or more single lens elements. In most cases, the focus-control lens 110 produces a diverging beam, but in some examples, the focus-control lens 110 causes the beam 104 to initially converge to a focus, then expand as it propagates away from the focus. Upon exiting the focus-control lens 110, the beam 104 is directed along the optical axis 124 toward an objective lens assembly 116, which converges the beam 104 as it exits the objective lens assembly 116. The converging beam is then directed toward a first reflective surface 118, which reflects the beam 104 toward a second reflective surface 120, which reflects the beam toward a substrate 122 at which the beam 104 is focused at focal point 126. Typically, the beam 104 is focused at some portion of a substrate thickness, but beam focus can be in front of or behind the substrate as well as within the substrate 122.

As shown in FIG. 1, the reflective surfaces 118, 120 of the system 100 can be adjustable in order to steer the beam with respect the substrate 122. As one example, the surfaces 118, 120 can be reflective surfaces coupled to first and second galvanometers 119, 121, respectively, and thus their orientations can be manipulated and controlled using a control system 140 that provides scan and focus control. The control system 140 is also coupled to one or more galvanometers or other focus adjustment mechanisms 114 that displace the focus-control lens 110 along the axis 124. As shown in FIG. 1, the focus-control lens 110 can be moved to a variety of positions, such as a position 115 shown in dashed lines. With such movements, the focus-control lens 110 provides an input beam to the objective lens assembly 116 so that the beam is focused at an acceptable location so as to compensate for non-flat focal planes or curved and/or non-planar substrates.

While the focus-control lens 110 can adjust focus of the beam 104 at the substrate, large beam displacements along the axis 124 are generally not available. Instead, the housing 112 of the focus-control lens 110 is secured to a translation stage 130 so as to move the focus-control lens 110 along the axis 124. These relatively larger motions of the housing 112 and the focus-control lens 110 permit an extended range over which the beam 104 can be focused, and thus permit corresponding variations in beam spot size at a focus location. The substrate 122 is positioned along the axis 124 with a translation stage 131 so that beams of various spot sizes can be focused at the substrate 122. For convenient description, such adjustments of the focus-control lens 110 with the translation stage 130 can be referred to as beam diameter adjustments.

Figure 2:
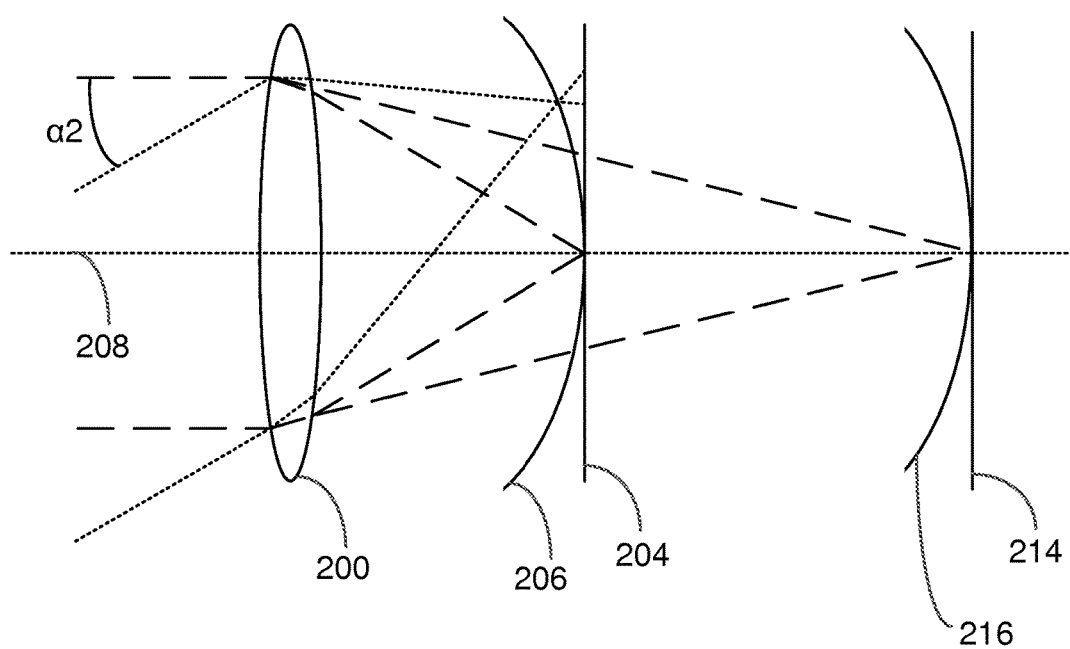
FIG. 2 illustrates displacements associated with beam diameter adjustment.

The system of FIG. 1 permits maintaining focus even across curved or non-planar target surfaces. FIG. 2 illustrates focusing of an optical beam with a system such as the system 100. An objective lens 200 is situated to focus the optical beam along an axis 208. For a fixed lens position, and a beam focus along the axis 208, the beam is generally not in focus across a plane 204 as scanned. Instead, the scanned beam focus defines a curved surface 206. In order to focus on a flat substrate (or substrate of other shape), a focus-control lens is adjusted to establish beam focus on the plane 204 (or other surface). As shown in FIG. 2, typically the greater the angle between ray directions and the axis 208 (i.e., the larger the angle α2 is), the greater this displacement of the actual focus from the plane 204. To vary beam spot size, a focus-control lens is translated with, for example, a translation stage 130 as shown in FIG. 1. With such an adjustment, a beam can be focused with a different beam diameter at an alternative focal plane 214 using a focus-adjust lens to correct the curved field focal surface 216. In this manner, beam focus is accomplished primarily with relatively smaller (and typically faster) focus adjustments while beam spot size is adjusted with relatively large (and typically slower) beam spot size adjustments.

In some systems, servomotors or other motion control devices (or piezoelectric devices, galvanometers, translation stages, etc.) can be situated so as to move a focus-control lens to correct for field curvature and maintain beam focus at a substrate. Additional servomotors (or piezoelectric devices, galvanometers, translation stages, etc.) can be situated to move the focus-control lens to further adjust the location of beam focus along the optical axis, typically to adjust beam diameter.

Figure 3:
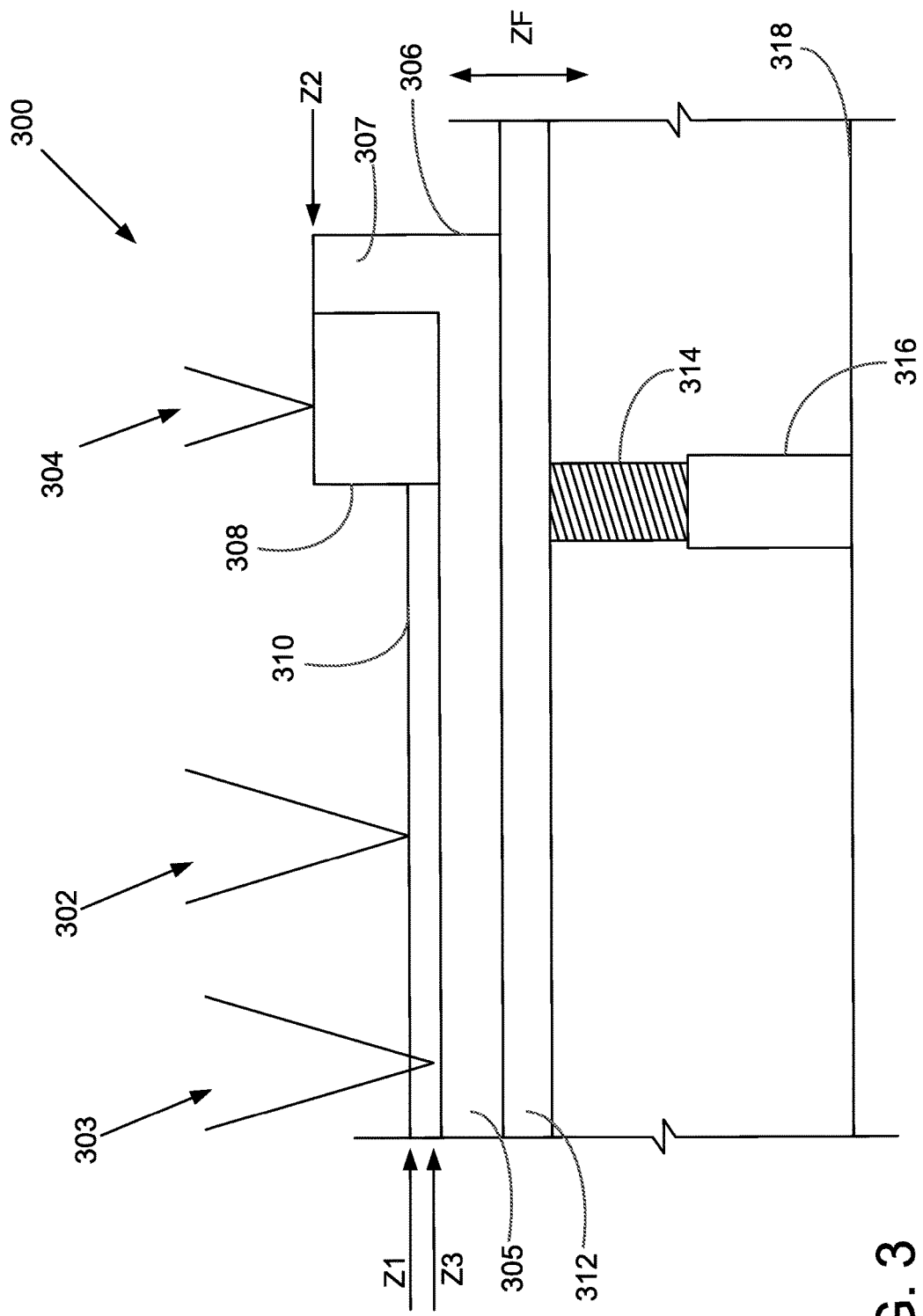
FIG. 3 shows a composite material being processed with a system such as illustrated in FIG. 1.

Referring generally to FIG. 3, a cross-sectional view is shown of three (typically pulsed) laser beams 302, 303, 304, each with selected laser pulse parameters, directed to a composite 300 and focused at different composite features. As shown, the composite 300 includes a substrate 306 having a lower portion 305 and a peripheral lip 307, a peripheral conductive border 308, and a layer 310 of conductive material deposited on a top surface of the substrate 306. In some examples, the substrate 306 has a constant or fixed thickness, or can have a variable thickness, depending upon the application for which the composite is intended. In some examples, the peripheral conductive border 308 comprises a conductive silver paste.

In some embodiments, the composite 300 can be processed to be used as a capacitive touchscreen in electronic devices. In such embodiments, the composite 300 can be transparent such that it can overlay the display of an electronic device to provide touchscreen capabilities without impeding a user's view of the display. The thin layer 310 can comprise the main body of the touchscreen (i.e., it can overlay the display), and the border 308 can comprise one or more integrated circuit (IC) raceways to couple the ICs to the main body of the touchscreen. The ICs can be used to, for example, determine the location(s) of touch events on a touchscreen based on changes in capacitance(s) at various locations on the touchscreen. The raceways couple the IC to the touchscreen itself to enable these determinations.

In various electronic devices, it can be desirable that the thin layer 310 overlay the entirety of the device's display, in order to allow the user to interact with the full extent of the display. Thus, it can be necessary to fit the IC raceways within the bezel of the electronic device. As electronic device bezels are made smaller, it can be advantageous to similarly reduce the size of the IC raceways (so they can fit within the bezel) and to be able to more finely control their properties (e.g., their conductivities and dimensions).

Because the border 308 and the thin layer 310 serve different purposes, they can be processed in different ways to achieve different results. For example, it can be advantageous to non-ablatively process the thin layer 310 such that it maintains a uniform thickness and appearance to a user. However, it can be advantageous to ablatively process the border 308 in order to form the IC raceways from the continuous border 308. Further, the planes z1, z2, and z3, on which the pulsed laser beams 302, 304, and 303, respectively, are focused to process the layer 310 and border 308, are separated from one another along the optical axes of the pulsed laser beams 302, 303, 304. Thus, the techniques described herein, which allow the processing of both the layer 310 and border 308 with a single system, provide various advantages.

As explained above, FIG. 3 illustrates components of a composite being processed by a laser patterning system such as the system 100. In accordance with the foregoing descriptions, the system 100 can be used to process the thin layer 310 and the border 308 in a variety of different ways. For example, the system 100 can be employed to non-ablatively process the thin layer 310, as explained in greater detail below. The system 100 can also be employed to ablatively process the border 308, as also described in further detail below. In such processing steps, movement of the focus-control lens 110 can be automated to correct for field curvature. Movement of the housing 112 can be controlled either manually or through a computer-controlled servo module to control the location of the focal point of a laser beam in the direction of the optical axis of the beam.

Thus, as shown in FIG. 3, a pulsed laser beam 302 can be controlled to be focused on an exposed surface of the thin layer 310 at a focal plane z1, in order to non-ablatively process the layer 310. Similarly, a pulsed laser beam 304 can be controlled to be focused on an exposed surface of the border 308 at a focal plane z2, in order to ablatively process the layer 308. Further, in cases where a laser beam is used to ablatively process the composite 300, the laser beam can be continuously controlled so that it focuses at the surface of the material (which can move as ablation occurs). In some cases, it is desirable to minimize the spot size of the laser beam on the surface it is processing. In such cases, the focal plane of the laser beam is coincident with the exposed surface of the material being processed, as illustrated for laser beams 302 and 304. In other cases, however, larger feature sizes and thus larger spot sizes may be used. In such cases, the focal plane of the laser beam can be offset from the exposed surface of the material being processed along the optical axis of the laser beam, as illustrated for laser beam 303. Thus, the scanning laser systems described herein allow for adjustment of feature sizes.

In some cases, a distance between a laser scanning system and a surface of a material to be processed can be adjusted to, for example, increase the distance to provide a larger field size, to decrease the distance to improve accuracy, or to vary focused spot size. Thus, in some cases, a material to be processed by a laser scanning system can be situated on an adjustable surface, which can be moved to adjust the distance between the scanning system and the surface to be processed. For example, as shown in FIG. 3, the composite 300 can be situated on a platform 312, which can be adjustable along an axis ZF. Various mechanisms can be used to adjust the platform 312 along the ZF axis. As one example, the platform can be coupled to one or more threaded rods 314 threaded into respective hollow tubes 316 having corresponding threads on inner surfaces. Thus, rotation of the tubes 316 causes motion of the platform 312 and thus the composite 300 along the axis ZF. The tubes 316 can be supported on a base unit 318. Of course, any other translation mechanisms can be used as well.

Figure 4:
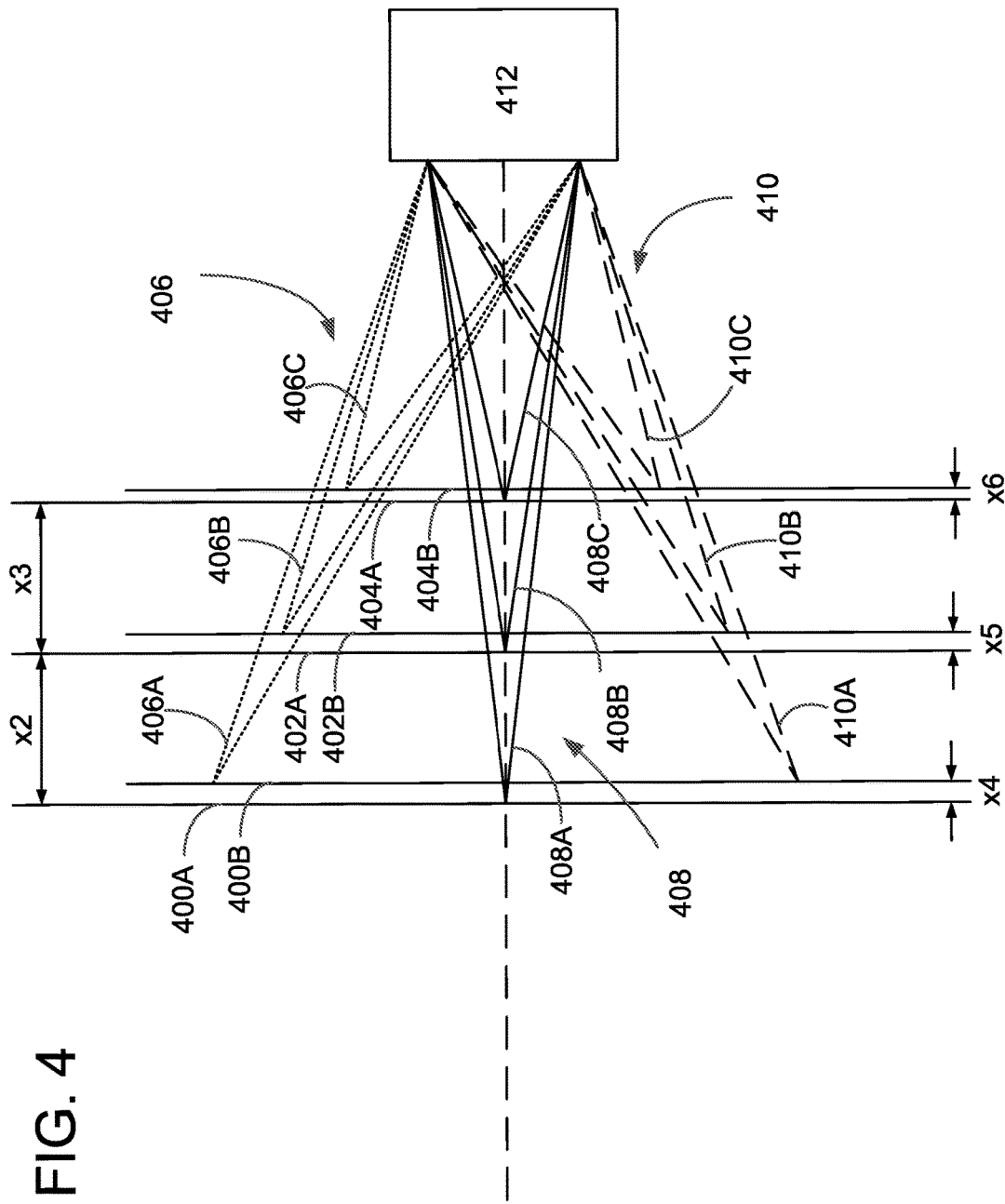
FIG. 4 illustrates focal regions associated with different beam diameters.

FIG. 4 shows laser beams 406, 408, 410, each propagating along different axes as directed by a laser scanning system 412, which can have a configuration similar to that of system 100. Each of the laser beams 406, 408, 410, is shown in three different configurations (as beams 406A, 406B, 406C or 408A, 408B, 408C, or 410A, 410B, 410C, respectively): in a first configuration focused on a first focal plane 400A or 400B (i.e., as shown at 406A, 408A, and 410A), in a second configuration focused on a second focal plane 402A or 402B (i.e., as shown at 406B, 408B, and 410B), and in a third configuration focused on a third focal plane 404A or 404B (i.e., as shown at 406C, 408C, and 410C). Focal plane 400A is farther from the system 412 than focal plane 402A by a distance x2, and focal plane 402A is farther from the system 412 than focal plane 404A by the distance x3. The distances x4, x5, x6 typically correspond to different focus locations corresponding to field curvature in an objective lens. Thus, an objective lens may form a beam focus for a target portion of a substrate situated on the objective lens axis at the plane 400A; absent a focus adjustment, the beam incident to an off-axis target portion would be focused on the plane 400B. As noted above, a focus-control lens can be provided to adjust focal position to compensate.

Displacements x2, x3 are generally provided to correspond to larger translations of a focus-control lens so as to produce beam spot size changes. The displacements x2, x3 are generally unequal, and a beam spot size as focused at the plane 400A is typically larger than a beam spot size at the plane 402A which is in turn larger than a beam spot size for focus at the plane 404A. As shown in FIG. 3, a processing system is configured to provide focus adjustments (x4, x5, x6) at locations associated with different beam spot sizes (i.e., at displacements x2, x3).

Figure 5:
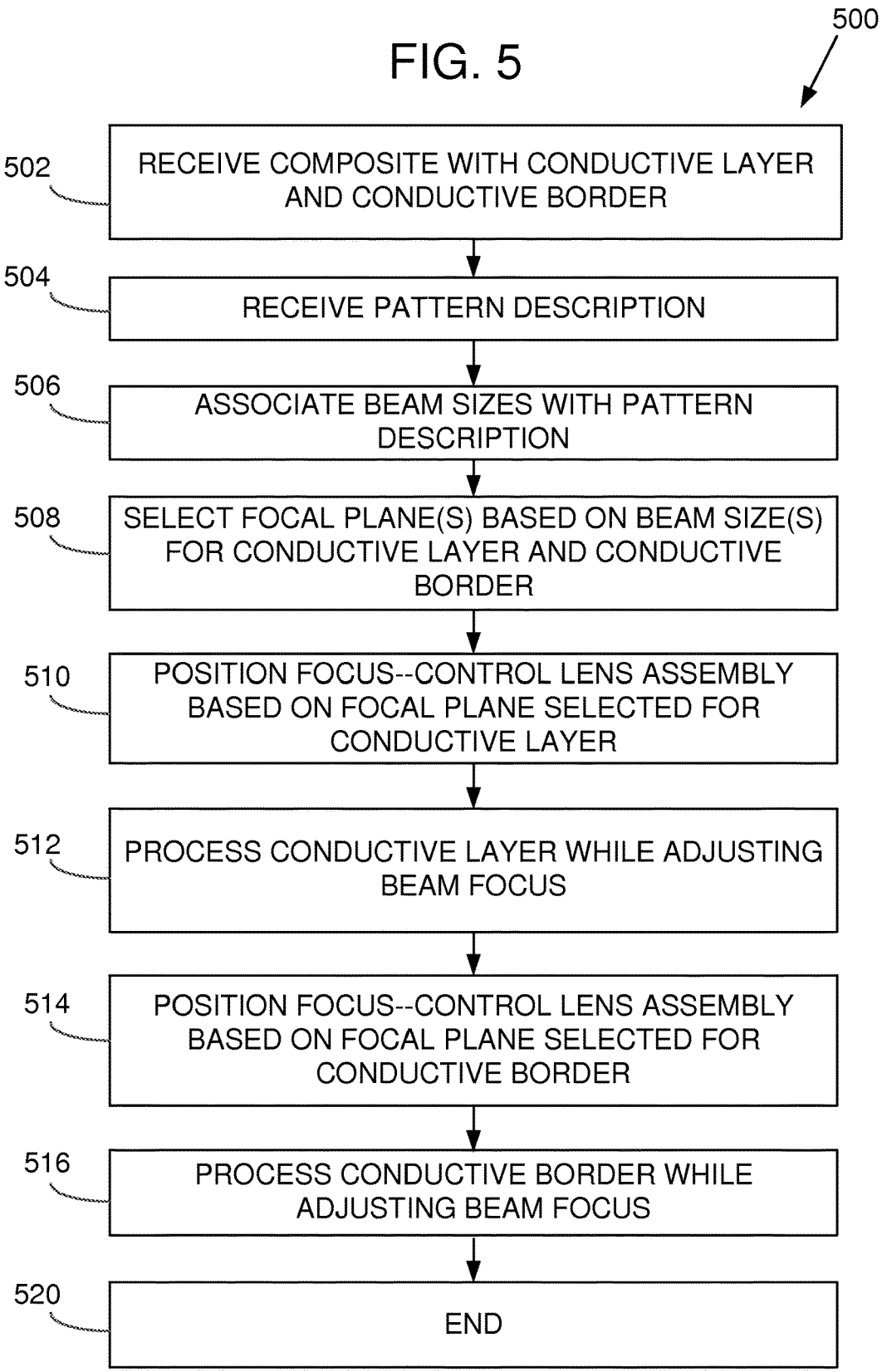
FIG. 5 shows a method of processing a composite material.

FIG. 5 shows an exemplary method 500 for processing a composite such as a composite to be processed for use as a touchscreen in an electronic device. At 502, a composite that includes a substrate having a conductive layer and a conductive border formed thereon is selected. At 504, a pattern or process description is obtained that indicates how various portions of the composite are to be processed, and can include pattern layouts, dwell times, feature sizes, types of processing (e.g., ablation or other processes). At 506, processing beam parameters such a power, wavelength, pulse repetition rate, pulse energy, and beam spot size are associated with the pattern description. At 508, focal planes (or working distances) are selected to produce the selected beam spot sizes. At 510, a focus-control assembly is positioned so that a beam from the focus-control assembly is focused to a suitable beam spot size at the selected focal plane. As shown in FIG. 5, the focal plane is selected for processing the conductive layer. At 512, the conductive layer (or other substrate regions) is processed with the selected spot size/working distance with focus control provided by a focus-control lens. At 514, a focus-control assembly is positioned so that a beam from the focus-control assembly is focused to another suitable beam spot size at another selected focal plane. As shown in FIG. 5, this focal plane is selected for processing the conductive border. At 516, the conductive border (or other substrate region) is processed with the selected spot size/working distance with focus control provided by a focus-control lens. Processing terminates at 520. A plurality of different working distances and beam spot sizes can be used, based on the pattern description. While a range of beam spot sizes can be used, such as beam diameters of between 2 µm and 10 mm, 4 µm and 1 mm, 5 µm and 0.5 mm, or 8 µm and 0.2 mm, typical beam spot sizes are between 10 µm and 100 µm. These beams can generally process composites that include conductive silver paste or silver nanowires to have features of corresponding sizes.

Ablative and Non-Ablative Processing of the Conductive Layer and Border

In some cases, the conductive layer is processed non-ablatively so it can be used as a touch-sensitive screen in electronic devices and the conductive border is processed ablatively so that it forms IC raceways leading from the touch-sensitive screen to an integrated circuit. In alternative embodiments, however, either the conductive layer or the conductive border can be either ablatively or non-ablatively processed, as is suitable for the particular embodiment. As used herein, ablative processing is understood to mean substantial removal of material from a target caused by an incident optical beam by vaporization, photochemical alteration, or otherwise. Similarly, non-ablative processing is understood to mean that the structural features of the existing target surface topology remain intact after processing, even if electrical or other properties of the target are changed.

In some cases, the layers of conductive materials includes a random arrangement of silver nanowires. The silver nanowires of such layers can be secured to a substrate in a polymer matrix, such as an organic overcoat. A laser beam can deliver laser pulses to such a layer and create a processed portion where the conductivity of the material of conductive layer is substantially changed such that the processed portion is effectively non-conducting. As used herein, the terms "conductive" and "nonconductive" have meanings attributed to them that are generally understood in the art of printed electronics, touch sensor patterning, or optoelectronics. For example, suitable sheet resistances for a material such that it may be considered conductive include 30-250 Ω/sq, and suitable sheet resistances or electrical isolation measurements for a material such that the material may be considered non-conductive or electrically isolated include resistances greater than or equal to about 20 MΩ/sq. However, these sheet resistances are merely examples, and other conductive and non-conductive ranges may apply depending on the requirements of the particular application. Some processed substrates may be considered sufficiently conductive with sheet resistances below 500 Ω/sq, 1 kΩ/sq, 5 kΩ/sq, or 10 kΩ/sq, and may be considered non-conductive with sheet resistances greater than or equal to about 100 kΩ/sq, 1 MΩ/sq, or 100 MΩ/sq.

Laser pulses can be directed to the composite in various patterns such that particular regions and electrical pathways are formed on the substrate. By carefully selecting the characteristics of the laser pulse parameters, including pulse length, pulse fluence, pulse energy, spot size, pulse repetition rate, and scan speed, the substrate may be processed such that electrical characteristics thereof are altered in a predetermined way while the substrate and associated protective and conductive layers are not substantially damaged or structurally altered (e.g., ablatively).

Exemplary laser pulse parameters suitable for non-ablative processing of a conductive layer include a pulse length of about 50 ps, pulse fluence of about 0.17 J/cm$^2$, a spot size of about 40 μm (1/e$^2$), a scan rate of about 1 m/s with a pulse-to-pulse overlap of greater than 90%, a total pulse energy of about 12 μJ, and a pulse repetition rate of about 100 kHz, using optical radiation having a wavelength of 1064 nm (which has been found to interact with the substrate and other materials to a lesser extent than light of shorter wavelengths). Various other parameters are also suitable. For example, pulse repetition rates can be increased to 1 MHz, to 10 MHz, or to greater than 10 MHz to increase processing speeds. Pulse length can be selected to be shorter or longer. Pulse fluence can be adjusted to ensure that the target is processed non-ablatively. Possible pulse lengths include less than about 1 ps, 100 ps, 200 ps, 500 ps, 800 ps, or 1 ns. Other parameters can similarly be varied and optimized accordingly. Laser parameters suitable for non-ablative laser processing can be selected based in part on the relevant properties of the materials selected to be processed. For example, varying thickness of the substrate, the conductive layer, etc., can affect how laser pulse heat is distributed or result in other time-dependent effects requiring mitigation.

While the beams are generally described as being brought to a focus, other beam geometrical configurations and intensity distributions are possible, including an unfocused beam, line beams, square or rectangular beams, as well as beams with uniform, substantially uniform or preselected intensity profiles across one or more transverse axes. In some cases, a composite can be translated to help achieve geometrical features on its surface. In some cases, one or more laser beams impinge on a composite from either a top or back side direction so that the beam propagates through the substrate to the conductive layer such that the beam causes ablative or non-ablative changes to a conductive layer. In some cases, laser pulses cause a processed portion of a conductive layer to become non-conductive without changing the visible characteristics of the processed portion. Similarly, laser pulses can process a conductive border either ablatively or non-ablatively. Laser ablation of a conductive border can be achieved by increasing the energy content of the laser beam incident on the target surface. For example, the laser pulse parameters can be adjusted by increasing the pulse length, pulse fluence, total pulse energy, by using shorter wavelengths, or by decreasing the spot size. Suitable laser systems capable generally include pulsed fiber lasers, pulsed fiber amplifiers, and diode pumped solid-state lasers.

Exemplary Control System and Computing Environment

Figure 6:
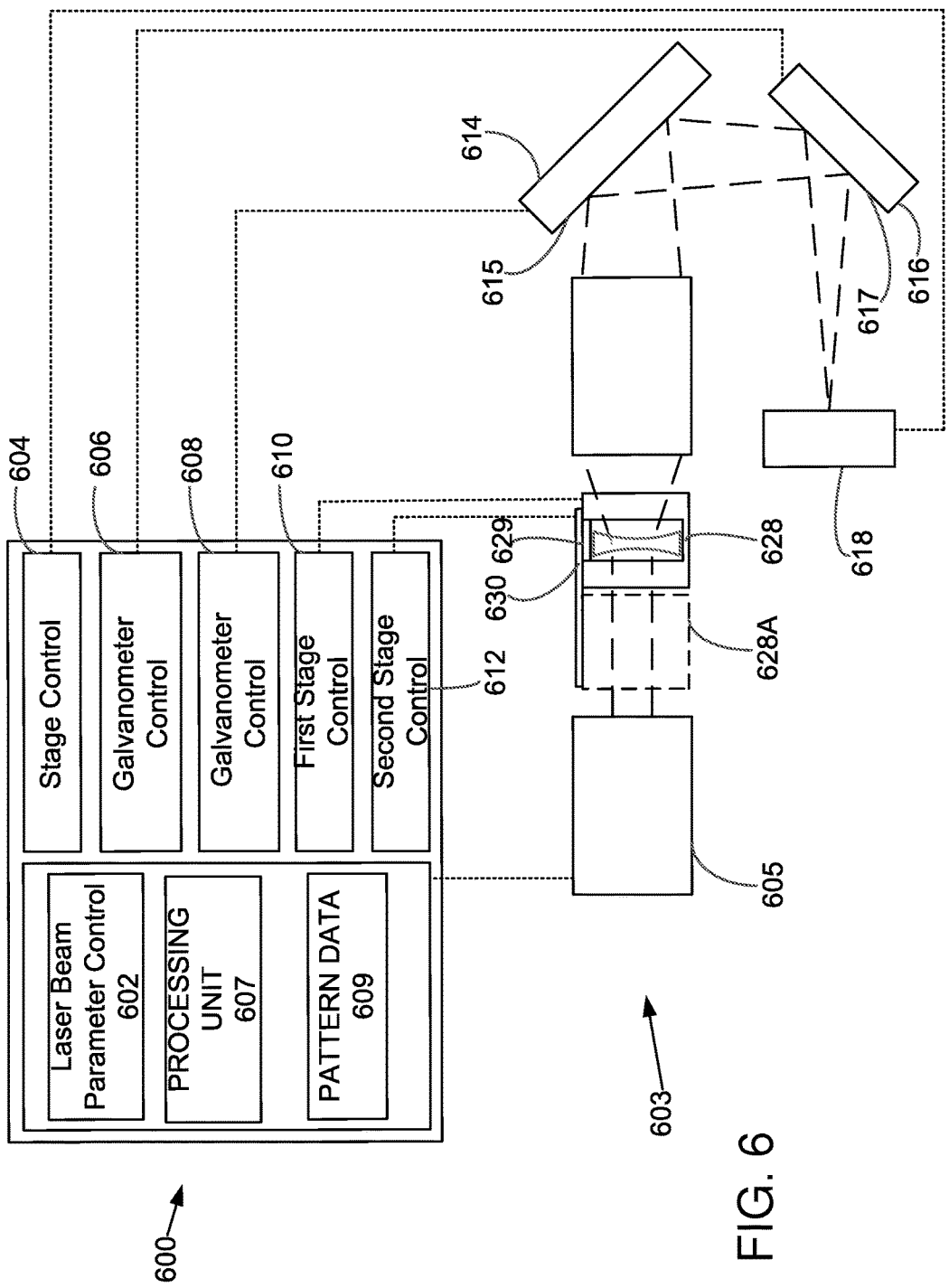
FIG. 6 shows an exemplary processing system that includes a control system and a laser scanning system.

FIG. 6 shows an exemplary laser processing system that includes a control system 600 for controlling a laser beam delivery system 603. As shown, the control system 600 can include a laser beam parameter control interface 602, a stage control interface 604, two galvanometer control interfaces 606 and 608 for controlling the scanning of a laser beam, and first and second stage control interfaces 610, 612. The laser beam parameter control interface 602 can be coupled to a source of a laser beam such as source 605, and can control parameters of the laser beam generated thereby, such as pulse length, pulse fluence, pulse energy, pulse light wavelength, etc. Typically, the control system 600 includes one or more processors 607 and a memory 609 that retains pattern data and instructions for processing pattern data for determining laser scan parameters. The control interfaces are typically implemented based on computer-executable instructions stored in one or more computer readable storage media such as magnetic disks or memory such random access memory.

The stage control interface 604 can be coupled to a substrate stage 618, which can control the location of a composite to be processed. The substrate stage 618 can comprise any of a variety of motion control devices such as piezoelectric or motorized scanning devices. The galvanometer control interfaces 606, 608 can be coupled to galvanometers 616, 614, respectively, which can control reflective surfaces 617, 615, respectively. The first and second stage control interfaces 610, 612, can be coupled to motion control devices 629, 630, respectively, and can control linear motion of the stages along an optical axis. The motion control device 629 is coupled to a focus-adjust assembly 628 so that beam focus can be maintained during beam scanning. The focus-adjust assembly 628 is secured to the motion control device 630 so as to select a suitable beam diameter for substrate processing. One additional location of the focus-adjust assembly 628 is shown at 628A. Adjustments of the focus-adjust assembly 628 with the motion control device 630 are generally accompanied with corresponding movement of the substrate 618 so that beam focus at a different beam diameter is achieved, while focus over a scan field can be maintained with the motion control device 629.

Figure 7:
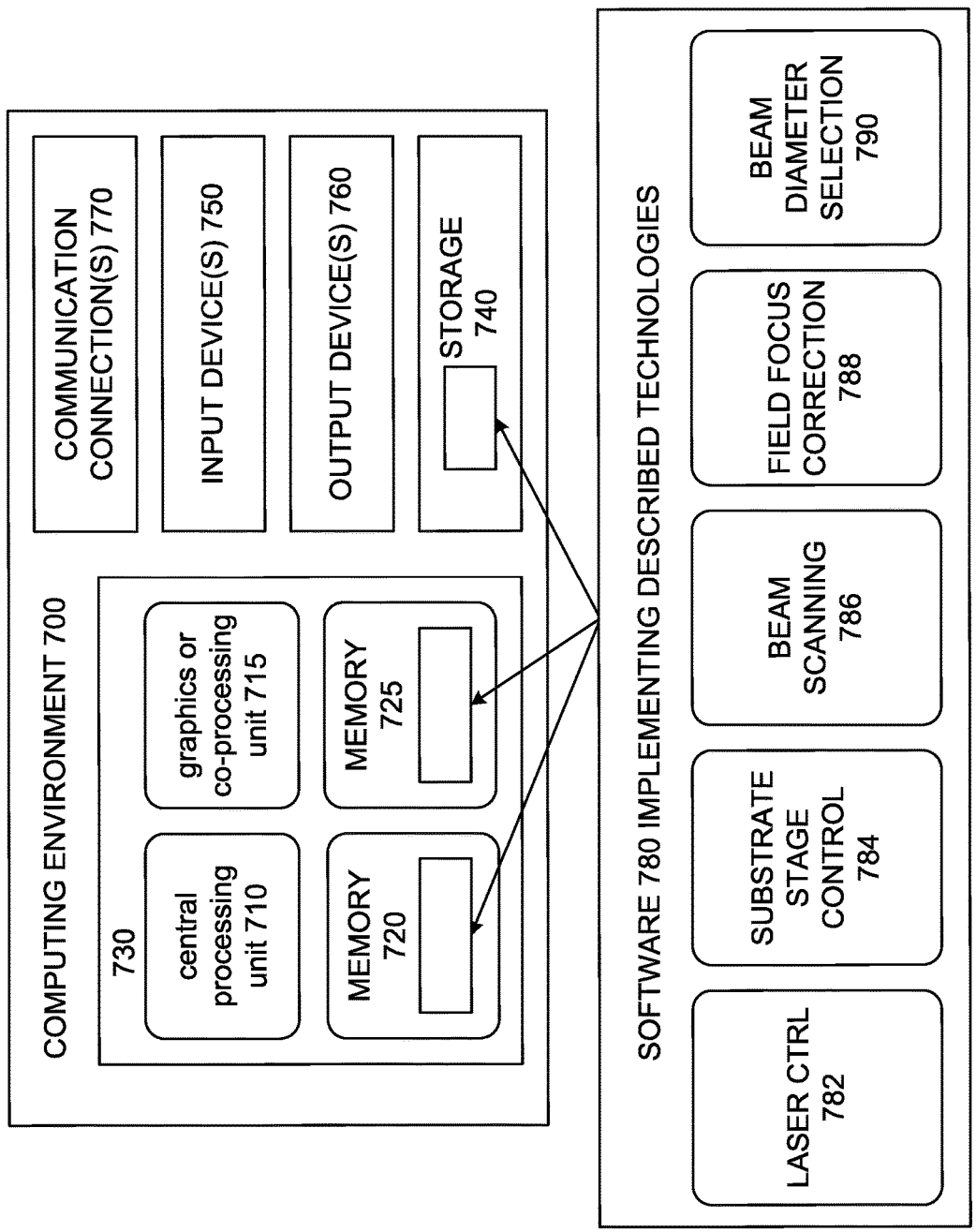
FIG. 7 shows an exemplary computing environment configured to control substrate processing with focus control and beam diameter adjustment.

FIG. 7 depicts a generalized example of a suitable computing environment 700 in which the described innovations may be implemented. The computing environment 700 is not intended to suggest any limitation as to scope of use or functionality, as the innovations may be implemented in diverse general-purpose or special-purpose computing systems. For example, the computing environment 700 can be any of a variety of computing devices (e.g., desktop computer, laptop computer, server computer, tablet computer, media player, gaming system, mobile device, etc.)

With reference to FIG. 7, the computing environment 700 includes a basic configuration 730 including one or more processing units 710, 715 and memory 720, 725. The processing units 710, 715 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 7 shows a central processing unit 710 as well as a graphics processing unit or co-processing unit 715. The tangible memory 720, 725 may be volatile memory (e.g., registers, cache, RAM), non-volatile memory (e.g., ROM, EEPROM, flash memory, etc.), or some combination of the two, accessible by the processing unit(s). The memory 720, 725 stores software 780 implementing one or more innovations described herein, in the form of computer-executable instructions suitable for execution by the processing unit(s).

A computing system may have additional features. For example, the computing environment 700 includes storage 740, one or more input devices 750, one or more output devices 760, and one or more communication connections 770. An interconnection mechanism (not shown) such as a bus, controller, or network interconnects the components of the computing environment 700. Typically, operating system software (not shown) provides an operating environment for other software executing in the computing environment 700, and coordinates activities of the components of the computing environment 700.

The tangible storage 740 may be removable or non-removable, and includes magnetic disks, magnetic tapes or cassettes, CD-ROMs, DVDs, or any other medium which can be used to store information in a non-transitory way and which can be accessed within the computing environment 700. The storage 740 stores instructions for the software 780 implementing one or more innovations described herein.

The input device(s) 750 may be a touch input device such as a keyboard, mouse, pen, or trackball, a voice input device, a scanning device, or another device that provides input to the computing environment 700. For video encoding, the input device(s) 750 may be a camera, video card, TV tuner card, or similar device that accepts video input in analog or digital form, or a CD-ROM or CD-RW that reads video samples into the computing environment 700. The output device(s) 760 may be a display, printer, speaker, CD-writer, or another device that provides output from the computing environment 700.

The communication connection(s) 770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Software 780 can include one or more software modules. For example, software 780 can include a laser beam software module 782 for setting laser beam parameters and/or controlling a source of a laser beam, a substrate stage motion module 784 for setting substrate position along an axis and controlling a substrate stage, and a beam scanning module 786 for determining parameters of a beam scanning system and/or controlling such a beam scanning system. One exemplary beam scanning system can include a pair of galvanometers. A focus control module 780 can also include a field focus correction module 788 for determining actions to be taken to correct for field curvature such as by motion of a focus-adjust lens. A beam diameter module 790 can control movements to focus a beam at a particular distance to obtain a selected beam diameter.

Although the operations of some of the disclosed methods are described in a particular, sequential order for convenient presentation, it should be understood that this manner of description encompasses rearrangement, unless a particular ordering is required by specific language set forth above. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

Figure 8:
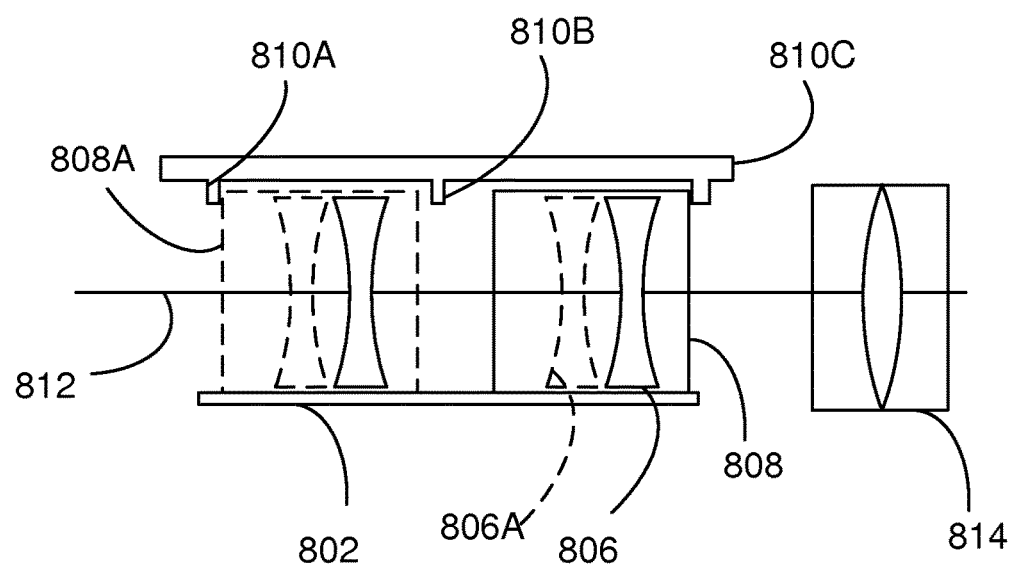
FIG. 8 illustrates a representative assembly for adjusting beam diameter.

FIG. 8 illustrates a focus assembly 808 that is translatable to fixed positions (such as 808A) based on assembly stops 810A-810C. A stage 802 translates the focus assembly 808 along an axis 812 of an objective lens 814. The focus assembly 808 includes a lens 806 that is translatable within the focus assembly 808 to adjust a beam focus location established by the objective lens 814 so as to compensate field curvature or non-planar substrates. One representative location of the lens 806 is shown at 806A.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. An optical processing system comprising:
   an objective lens situated to direct a processing optical beam to a target surface;
   a scanning system situated to scan the processing optical beam across the target surface;
   a focus-adjust optical system that includes a focus-adjust optical element and a focus actuator, the focus-adjust optical element situated to direct the optical beam to the objective lens, wherein the focus actuator is coupled to the focus-adjust optical element so as to translate the focus-adjust optical element along an axis of the objective lens so as to maintain a focus of the processing beam as the processing beam is scanned across the target surface; and
   a beam diameter actuator situated to translate the focus-adjust optical system so as to vary a focal plane position of the processing beam along the axis of the objective lens and to define a focused processing beam diameter at the target surface.

2. The system of claim 1, further comprising a controller coupled to the focus actuator so as to maintain the focus of the processing beam during scanning across the target surface.

3. The system of claim 2, further comprising a substrate stage that includes a stage actuator situated to position the target surface along the axis of the objective lens.

4. The system of claim 3, wherein the controller is coupled to the beam diameter actuator and the stage actuator and the controller translates the focus adjust optical system and the substrate stage based on a selected beam diameter.

5. The system of claim 4, wherein the beam diameter actuator produces stepwise translations of the focus adjust optical system.

6. The system of claim 5, wherein the beam diameter actuator is translatable to at least two locations along the axis of the objective lens, the at least two locations associated with corresponding focused beam diameters having a larger to smaller beam diameter ratio of at least 2:1.

7. The system of claim 6, wherein the beam diameter ratio is at least 5:1.

8. The system of claim 1, the beam diameter actuator is situated to translate the focus-adjust optical system so as to define at least two focused processing beam diameters corresponding to ablative processing and non-ablative processing, respectively.

9. The system of claim 8, wherein the at least two focused processing beam diameters correspond to ablative processing of a conductive border and non-ablative processing of a silver nanowire or indium tin oxide conductive layer, or vice versa.

10. The system of claim 9, further comprising a laser that produces the optical beam, and a laser controller that selects optical beam powers based on the focused processing beam diameters.

11. The system of claim 1, wherein the focus actuator is coupled to the focus-adjust optical element so as to translate the focus-adjust optical element along the axis of the objective lens so as compensate field curvature of the objective lens.

12. A method, comprising:
    translating a focus adjust optical element along an axis of an objective lens while processing a substrate with an optical beam from the objective lens so as to maintain a processing beam focus at a target wherein the focus-adjust optical element is coupled to a focus-adjust optical system housing; and
    translating the focus-adjust optical system housing along the axis of the objective lens with a translation stage so as to vary a processing beam focal plane position along the axis of the objective lens and adjust a focused processing beam diameter to correspond to a selected focused processing beam diameter.

13. The method of claim 12, wherein the selected focused processing beam diameter is selected from among at least two predetermined values, wherein the predetermined values have a larger to smaller beam diameter ratio of at least 1.5:1.

14. The method of claim 13, wherein the target is a composite having a conductive layer and a conductive border, wherein the at least two predetermined values include first and second focused processing beam diameters selected for processing the conductive layer and the conductive border, respectively.

15. The method of claim 14, wherein the first and second focused processing beam diameters are selected so that the conductive layer is processed non-ablatively and the conductive border is processed ablatively or vice versa.

16. The method of claim 15, wherein the focused processing beam diameters are selected to process one or more of a silver nanowire or indium tin oxide conductive layer and a silver paste conductive border.

17. The method of claim 12, further comprising translating the target along the axis of the objective lens based on the selected focused processing beam diameter.

18. The method of claim 12, wherein at least two focused processing beam diameters are selected for processing a conductive layer and a conductive border of a composite substrate, wherein the focused processing beam diameters are selected from among at least two predetermined values, wherein the predetermined values have a larger to smaller diameter ratio of at least 2:1.

19. The method of claim 18, wherein the two focused processing beam diameters are selected so that the conductive layer is processed non-ablatively and the conductive border is processed ablatively or vice versa.

20. The method of claim 18, further comprising selecting first and second optical beam powers corresponding to the two focused processing beam diameters.

21. An optical processing system comprising:
    an objective lens situated to direct a processing optical beam to a target surface;

a scanning system situated to scan the processing optical beam across the target surface;

a focus-adjust optical system that includes a focus-adjust optical element and a focus actuator, the focus-adjust optical element situated to direct the optical beam to the objective lens, wherein the focus actuator is coupled to the focus-adjust optical element so as to translate the focus-adjust optical element along an axis of the objective lens so as to maintain a focus of the processing beam as the processing beam is scanned across the target surface; and a beam diameter actuator situated to translate the focus-adjust optical system relative to the objective lens so as to vary a focal plane position of the processing beam along the axis of the objective lens and to define a processing beam diameter at the target surface.

* * * * *